United States Patent
Suto (10) Patent No.: US 8,330,268 B2
(45) Date of Patent: Dec. 11, 2012

(54) SEMICONDUCTOR PACKAGE AND MANUFACTURING METHOD THEREOF

(75) Inventor: Yuki Suto, Sakura (JP)

(73) Assignee: Fujikura Ltd., Tokyo (JP)

( * ) Notice: Subject to any disclaimer, the term of this patent is extended or adjusted under 35 U.S.C. 154(b) by 174 days.

(21) Appl. No.: 12/648,172

(22) Filed: Dec. 28, 2009

(65) Prior Publication Data

US 2010/0102437 A1 Apr. 29, 2010

Related U.S. Application Data

(63) Continuation of application No. PCT/JP2008/061773, filed on Jun. 27, 2008.

(30) Foreign Application Priority Data

Jun. 29, 2007 (JP) ................................ 2007-171915

(51) Int. Cl.
*H01L 23/12* (2006.01)
(52) U.S. Cl. ......................... 257/704; 257/433; 438/106
(58) Field of Classification Search .................. 257/704, 257/61, 433, 710; 438/25, 26, 106, 113
See application file for complete search history.

(56) References Cited

U.S. PATENT DOCUMENTS

| 7,671,461 B2 * | 3/2010 | Yang et al. ..................... 257/687 |
| 7,875,944 B2 * | 1/2011 | Higashi et al. ................ 257/434 |
| 2006/0131731 A1 * | 6/2006 | Sato ............................... 257/704 |
| 2007/0029654 A1 | 2/2007 | Sunohara et al. |

FOREIGN PATENT DOCUMENTS

| JP | 2002-373977 A | 12/2002 |
| JP | 2005-125447 A | 5/2005 |
| JP | 2005-136144 A | 5/2005 |
| JP | 2005-212017 A | 8/2005 |
| JP | 2006-108285 A | 4/2006 |
| JP | 2007-042741 A | 2/2007 |
| WO | 2006/109638 A1 | 10/2006 |

OTHER PUBLICATIONS

Office Action issued by the Japanese Patent Office in Japanese Patent Application No. 2007-171915 dated Sep. 25, 2012.

* cited by examiner

*Primary Examiner* — S. V. Clark
(74) *Attorney, Agent, or Firm* — Sughrue Mion, PLLC (57) ABSTRACT

A semiconductor package includes a semiconductor substrate having a semiconductor device arranged on one surface thereof; a cap substrate having one surface that opposes the one surface of the semiconductor substrate via a gap; a spacer that is arranged between the one surface of the semiconductor substrate and the one surface of the cap substrate, and that joins the semiconductor substrate and the cap substrate; and a filter that is provided on the cap substrate so as to overlap with the semiconductor device without overlapping with the spacer. The semiconductor package and method of manufacture can suppress exfoliation of the filter caused by chipping during the dicing step.

14 Claims, 9 Drawing Sheets

SEMICONDUCTOR PACKAGE AND MANUFACTURING METHOD THEREOF

CROSS-REFERENCE TO RELATED APPLICATIONS

This application is a Continuation of International Application No. PCT/JP2008/061773 filed Jun. 27, 2008, claiming priority based on Japanese Patent Application No. 2007-171915, filed Jun. 29, 2007, the content of which is incorporated herein by reference in their entirety.

BACKGROUND

1. Technical Field

The present invention relates to a semiconductor package and a manufacturing method thereof, and more specifically, to a countermeasure against exfoliation of a filter that is disposed in the semiconductor package, and even more specifically, to a countermeasure against exfoliation of a filter that is disposed on a cap substrate in packaging on a wafer level of a semiconductor device.

2. Related Art

For recent mobile phones, mobile information terminals, and mobile electronic devices such as digital cameras, their portability and weight saving are major market needs. For that reason, further reductions in the size and thickness of chips such as semiconductor integrated circuits that are mounted therein are essential. In addition, a stable manufacturing process is called for.

In optical semiconductor devices such as charge-coupled devices (CCDs) and complementary metal-oxide-semiconductors (CMOSs) that are mounted in these mobile electronic devices, optical filters, such as an infrared cut-off filter, are used. When applying these optical filters to a wafer level package of an optical semiconductor, package processing may be performed that consists of forming an optical filter on a glass substrate.

As procedures of forming a filter on a conventional glass substrate, there is a method that forms a filter on a glass substrate after the completion of package processing, and there is a method that first forms a filter on a glass substrate and then performs package processing. In the case of forming a filter in the interior of a package in order to protect the filter, the latter method is adopted. Also, although the former involves separately forming a filter in each package, the latter has the advantage of being able to form a plurality of filters at the wafer level all at once.

Figure 13:
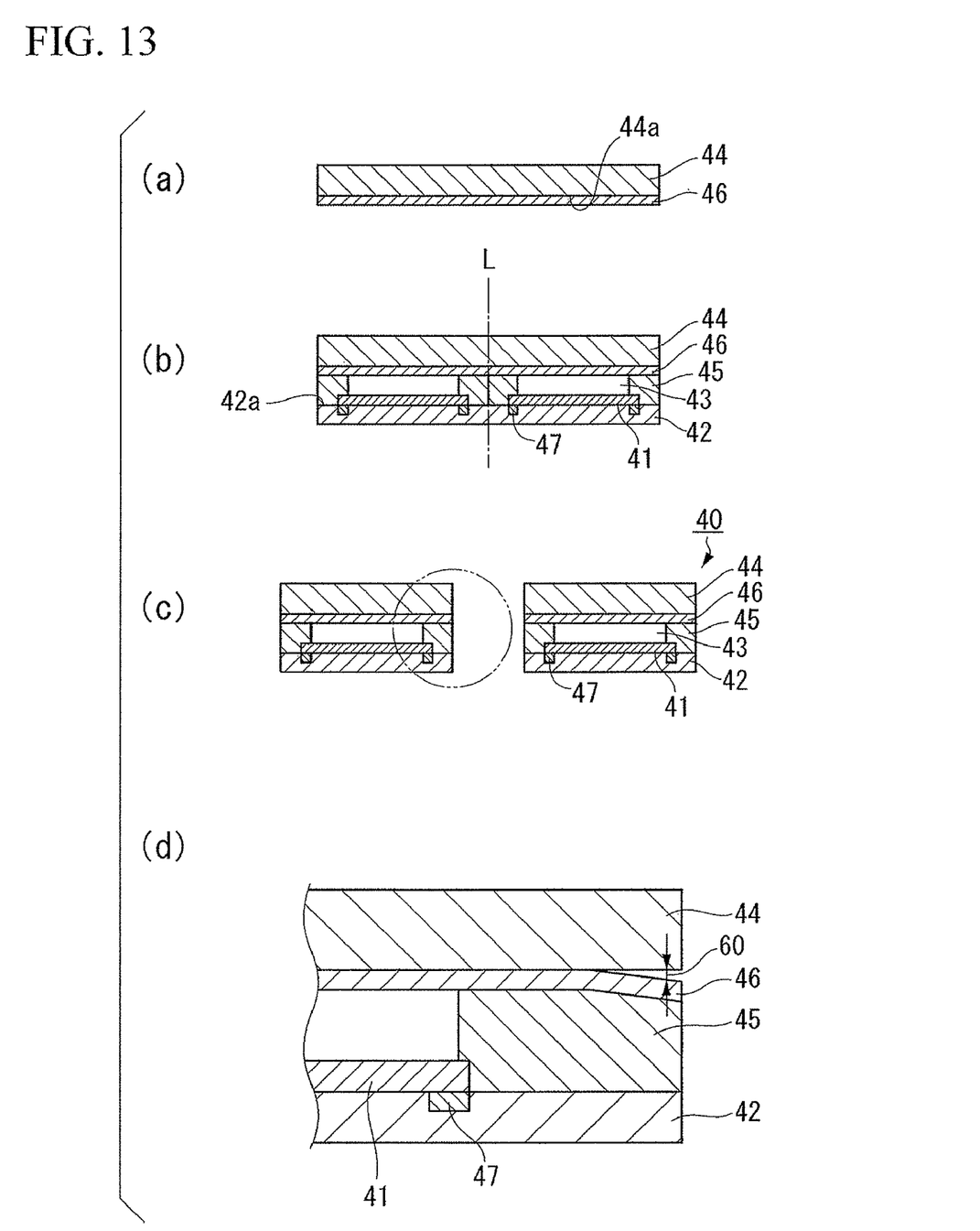
FIG. 13 is a drawing of a conventional semiconductor package and a cross-sectional process drawing illustrating a method of manufacturing thereof ((a) of FIG. 13 to (c) of FIG. 13), and a schematic drawing of filter exfoliation ((d) of FIG. 13).

FIG. 13 is a cross-sectional view of a manufacturing process for a conventional semiconductor package in which a filter is formed in a package. In the manufacturing process for this semiconductor package 40, as shown in (a) of FIG. 13, the filter 46 is disposed on a surface 44a of a cap substrate 44. Next, the filter 46 and a semiconductor substrate 42 are joined via a spacer 45. Next, as shown in (b) of FIG. 13, dicing of the semiconductor wafer is carried out at the location shown by the dashed line L. Due to chipping that occurs during this dicing process, there is the possibility of exfoliation of this filter 46 occurring as shown in (d) of FIG. 13. This exfoliation 60 of the filter 46 is magnified in a reliability test and the like, and at times it has caused the semiconductor package 40 to malfunction. Also, since the spacer 45 is directly adhered to the filter 46, when the adhesion between the filter 46 and the cap substrate 44 is weak, there is the possibility of the filter 46 exfoliating under the stress arising from expansion and contraction of the spacer 45.

SUMMARY OF THE INVENTION

The present invention was achieved in view of the above circumstances, and has as its first object to provide a semiconductor package that is capable of suppressing exfoliation of a filter due to chipping in the dicing process. Also, the present invention has as its second object to provide a method of manufacturing a semiconductor package that is capable of suppressing exfoliation of a filter in the dicing process.

A first aspect of the semiconductor package is a semiconductor package that includes a semiconductor substrate having a semiconductor device disposed on one surface thereof, a cap substrate having one surface arranged opposite to the semiconductor substrate via a gap from the one surface of the semiconductor substrate, with the one surface provided with a flat portion over the entire area or a regional projecting portion along with the flat portion, a spacer that is provided in a protruding manner at the flat portion or projecting portion of the one surface of the cap substrate opposite to the semiconductor substrate and that bonds the cap substrate and the semiconductor substrate, and a filter that is disposed on the cap substrate and at a position overlapping with the semiconductor device and not overlapping with the spacer.

In a second aspect of the semiconductor package, the filter in the first aspect is disposed between the semiconductor substrate and the cap substrate.

In a third aspect of the semiconductor package, the filter in the first aspect is disposed on an other surface of the cap substrate opposed to the one surface of the cap substrate.

In a fourth aspect of the semiconductor package, the filter in the first aspect has a first filter and a second filter, wherein the first filter is disposed between the semiconductor substrate and the cap substrate, and the second filter is disposed on the other surface of the cap substrate.

A fifth aspect of the semiconductor package includes an electrode that is on one surface of the semiconductor substrate and in electrical contact with the semiconductor device, a penetration electrode that is provided between the other surface of the semiconductor substrate and the electrode, and a solder bump that is electrically connected with the penetration electrode.

A first aspect of a method of manufacturing a semiconductor package is a method of manufacturing a semiconductor package that includes a semiconductor substrate having a semiconductor device disposed on one surface thereof, a cap substrate having one surface arranged opposite to the semiconductor substrate via a gap from the one surface of the semiconductor substrate, with the one surface provided with a flat portion over the entire area or a regional projecting portion along with the flat portion, a spacer that is provided in a protruding manner at the flat portion or projecting portion of the one surface of the cap substrate opposite to the semiconductor substrate and that bonds the cap substrate and the semiconductor substrate, and a filter that is disposed on the cap substrate at a position that overlaps with the semiconductor device without overlapping with the spacer. The method includes in the following order forming a plurality of the filters on the cap substrate; bonding the semiconductor substrate, which is provided with a plurality of the semiconductor devices so as to sandwich dividing portions therebetween on the one surface of the semiconductor substrate, and the cap substrate, which is provided with the filter, via the spacers at the diving portions; and dividing a structure that includes the cap substrate, the semiconductor devices, the semiconductor substrate, and the spacer at a region where the spacer is in the direction in which the semiconductor substrate and the cap substrate overlap.

A second aspect of the method of manufacturing a semiconductor package of the present invention further includes forming a penetration electrode to be electrically connected from the other surface side of the semiconductor substrate toward the semiconductor device, and forming a solder bump that is electrically connected with the penetration electrode.

In a semiconductor package, a cap substrate is arranged via a gap opposite from one surface of a semiconductor substrate in which a semiconductor device is disposed on one surface. A spacer is provided in a protruding manner on a surface of this cap substrate opposite to the semiconductor substrate and bonds the semiconductor substrate and the cap substrate. Also, a filter is disposed on the cap substrate so as to overlap with the semiconductor device, and is at a position that does not overlap with the spacer.

With this constitution, since the division location of the semiconductor package is at a position that divides the spacer into two, it is possible to prevent exfoliation of the filter due to chipping without dividing the filter.

Also, in a method of manufacturing a semiconductor package, after forming the filter on the one surface of the cap substrate so as to overlap the semiconductor device, the spacer which is located in a position that does not overlap the filter brings into opposition and bonds the semiconductor substrate on which a plurality of semiconductor devices are disposed by providing a dividing portion and the cap substrate. Thereafter, a structure that is formed by the semiconductor substrate, the cap substrate, and the spacer being bonded is divided at a location that divides the spacer into two. In this manufacturing process, since the filter is not disposed at the place of division of the semiconductor package, in the division step, it is possible to prevent exfoliation of the filter from the cap substrate due to chipping.

BRIEF DESCRIPTION OF THE DRAWINGS

The aspects and advantages of the exemplary embodiments of the present invention will be described with reference to the figures in which.

DETAILED DESCRIPTION OF THE INVENTION

Hereinbelow, the exemplary embodiments of the present invention shall be described with reference to the drawings.

The present invention is not restricted by these exemplary embodiments.

1. First Exemplary Embodiments of Semiconductor Package

Figure 1:
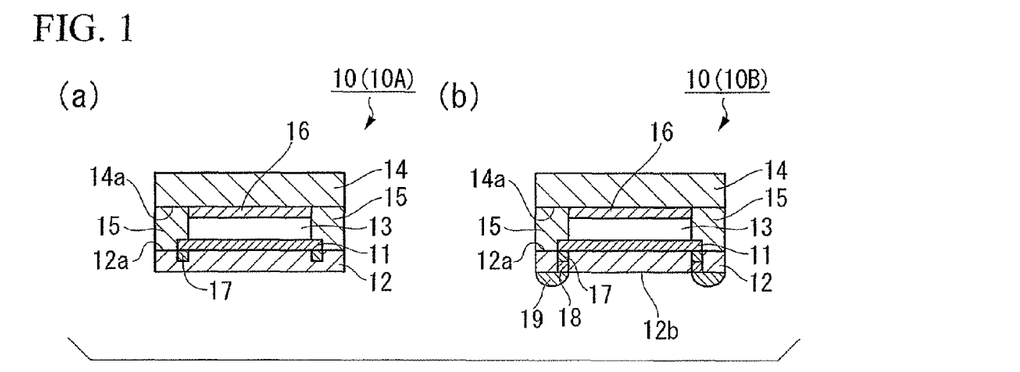
FIG. 1 is a cross-sectional view of an exemplary embodiment of the semiconductor package.
Figure 2:
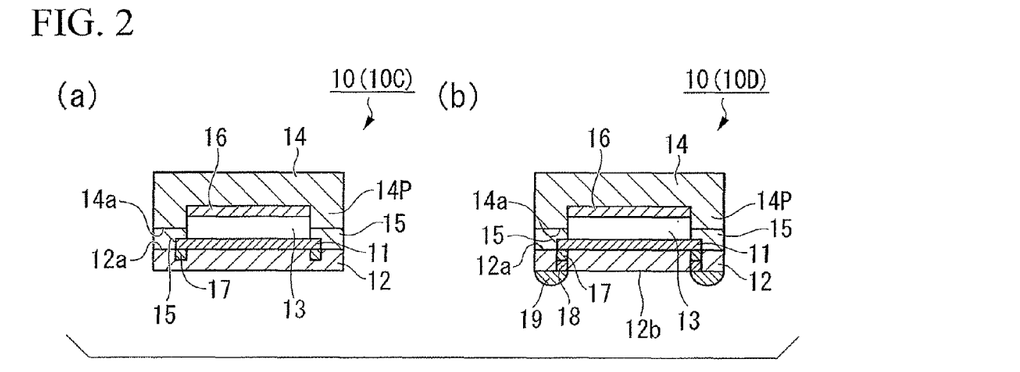
FIG. 2 is a cross-sectional view of an alternative exemplary embodiment of the embodiment of FIG. 1.

FIG. 1 is a cross-sectional view that shows the first exemplary embodiment of the semi-conductor package according to the present invention. FIG. 2 is a cross-sectional view of an alternative exemplary embodiment of that shown in FIG. 1.

As shown in FIG. 1, in the semiconductor package 10A, a semiconductor device 11 is disposed on a surface 12a of a semiconductor substrate 12. From this semiconductor substrate 12, a cap substrate 14 is disposed opposite the semiconductor substrate 12 via a gap 13. Also, a spacer 15 is provided in a protruding manner on a surface 14a of the cap substrate 14 opposite to the semiconductor substrate 12, and bonds the semiconductor substrate 12 and the cap substrate 14. Furthermore, a filter 16 is disposed on the surface 14a of the cap substrate 14 so as to overlap with the semiconductor device 11 but not to overlap with the spacer 15. The term "overlap" as used throughout the specification refers to overlapping when viewed from above or below the semiconductor device, i.e., when viewed from a plane extending parallel to the semiconductor device.

An image sensor such as a CCD or CMOS may be used as the semiconductor device 11. Moreover, a MEMS (Micro Electro Mechanical System) device or the like can be used, with examples including a micro relay, a microswitch, a pressure sensor, an acceleration sensor, a high-frequency filter, a micro mirror, and the like.

As the material of the semiconductor substrate 12, for example, gallium arsenide, glass, ceramic, germanium, silicon, and the like may be used. Moreover, an electrode 17 may be in electrical contact with the semiconductor device 11 disposed on the surface 12a of the semiconductor substrate 12. In relation to this electrode 17, provided it is in electrical contact with the semiconductor device 11, it is not particularly limited, but the arrangement location may be on the surface 12a of the semiconductor substrate. Concerning the material of the electrode 17, Al, Al—Cu, Al—Si—Cu or the like may be used. This may be used as an I/O pad.

In relation to the gap 13, it is not particularly limited, and can be freely selected corresponding to conditions such as the specification demanded from the semiconductor device 11 or the like. For example, if the gap 13 is sized in the range of several μm to several hundred μm, it is possible to ensure a sufficient cavity in the vicinity of the semiconductor device 11, and it is possible to control the dimensions of the semiconductor package 10.

In the case of the semiconductor device 11 being an image sensor, such as a CCD, a CMOS, or the like, when the distance between the semiconductor substrate 12 and the cap substrate 14 becomes too close, the semiconductor device 11 may be susceptible to particles adhering to the cap substrate 14 and the like. In such a case, it is possible to increase a height of the gap 13 that is disposed between the semiconductor substrate 12 and the cap substrate 14 by increasing the size of the spacer 15.

The cap substrate 14 is arranged above the semiconductor device 11 via the gap 13, and has a role of protecting the semiconductor device 11 or the like. The cap substrate 14 may be a plate that consists of resin or glass, metal or the like, and in the case of applying to an optical semiconductor device such as a CCD, a CMOS, or the like, the plate may be a material, such as glass or the like, that has light transmittance. Also, the cap substrate is preferably parallel to and opposite to the semiconductor substrate 12.

In order to secure the gap 13 between the semiconductor substrate 12 and the cap substrate 14 using the spacer 15, when joining the cap substrate 14 and the semiconductor substrate 12, the spacer 15 is provided at a predetermined position so as to enclose the periphery of the semiconductor device 11 without a break and not to cover the top of the semiconductor device 11. Thereby, the gap 13 adjacent the semiconductor device 11 is hermetically sealed by the semiconductor substrate 12, the cap substrate 14, and the spacer 15.

Materials used for the spacer 15 include, for example, varnish or paint, dry film or the like consisting of photosensitive or non-photosensitive resin (UV curing resin, visible-light curing resin, infrared-light curing resin, thermosetting resin, etc.). The material suitable for the spacer 15 should be selected in accordance with the usage environment of the semiconductor package. In particular, a resin with excellent chemical resistance and thermal resistance, such as a polyimide or phenol resin, may be used. In the case of a polyimide resin, by calcinating the resin layer that will form the spacer, after forming the resin layer, a crosslinking reaction is caused in the resin layer thereby improving the chemical resistance and thermal resistance.

In the case of the material that constitutes the spacer 15 having photosensitivity, the photosensitive material may include a photosensitive resin such as epoxy acrylate and a photosensitive glass paste and the like.

When calcinating polyimide resin or glass paste, by forming the spacer 15 on the cap substrate 14 side and performing calcination of the spacer 15 prior to joining of the cap substrate 14 to the semiconductor substrate 12, it is possible to avoid damage of the semiconductor device 11 by the heat of the calcination.

Moreover, it is possible to hermetically seal the semiconductor package, for example, by making the spacer from a metal bond such as Sn or Au, glass, Si, and the like. Thereby, it is possible to prevent dew condensation in the gap 13.

In relation to the filter 16, the type of the filter 16 to be used is not limited, and a notch filter or ND filter, a band pass filter, and the like can be freely selected depending on the use of the semiconductor device 11. When using a CCD or a CMOS as the semiconductor device, primary color filters that consist of red, green, and blue, complementary color filters that consist of cyan, magenta, yellow, and green, and/or an IR cut-off filter, etc may be used.

The filter 16 is disposed on the surface 14a side of the cap substrate 14 at a position that overlaps the semiconductor device 11. This filter 16 may be directly disposed on the surface 14a side of the cap substrate 14, or may be disposed via an object which is disposed on the surface 14a side of the cap substrate 14.

Since the filter 16 is arranged at a position that does not overlap with the dicing location and does not directly overlap with the spacer 15, it is possible to suppress exfoliation of the filter 16 that occurs from chipping during dicing. Also, since the spacer 15 is not bonded to the filter 16, it is possible to prevent exfoliation of the filter 16 arising from expansion and contraction of the spacer 15. Moreover, since the filter 16 is not disposed over the entire surface of the cap substrate 14, it is possible to relieve warping of the cap substrate 14 by the stress of the filter 16.

(b) of FIG. 1 illustrates an embodiment that includes a penetration electrode 18 and a solder bump 19. The penetration electrode 18 is provided between the other surface 12b side of the semiconductor substrate 12 and the electrode 17, and the solder bump 19 is provided in electrical connection with this penetration electrode 18.

In relation to the penetration electrode 18, an electrical conducting path is formed that enables the electrode 17 to conduct with the outside through the penetration electrode 18. The shape of the penetration electrode 18 is not particularly limited, but may be installed at a right angle to the semiconductor device 11. Also, as the material thereof, a metal, such as tin or copper, may be used. It is possible to form a back wiring layer on the other surface 12b of the semiconductor substrate 12 so as to make contact with this penetration electrode 18.

The solder bump 19 is formed on the other surface 12b of the semiconductor substrate where the penetration electrode 18 is disposed, and installed so as to be in electrical contact with the penetration electrode 18. In relation to the material of the solder bump 19, the solder alloy that is used is not particularly limited, but in the case of using a lead-free solder alloy, Sn Ag 3.0 Cu 0.5 or Sn Ag 3.5 Cu 0.7 may be used. Also, the size of the solder bump 19 and the pitch of forming the solder bump 19 are not particularly limited. For example, the size may be 30 to 250 μm and the pitch may be 100 to 400 μm.

By providing the penetration electrode 18 and the solder bump 19, compared to a conventional wire bonding, an improvement in the signal speed may be achieved.

FIG. 2 illustrates an alternative embodiment of that shown in FIG. 1, and is provided with a projecting portion 14P on the cap substrate 14. In the case of the spacer 15 consisting of resin, since the moisture permeability coefficient of resin is high, when the closure thickness of the resin is thick, there is a possibility of condensation forming in the gap 13. Also, if the distance from the semiconductor substrate 12 to the cap substrate 14 is short, optical problems related to imaging characteristics will arise. By equipping the cap substrate 14 with the projecting portion 14P in order to deal with both of these, the height of the resin layer having the high moisture permeability coefficient and forming the spacer 15 is reduced, and the condensation is suppressed. Furthermore, by controlling the projecting portion 14P on the cap substrate 14, it is possible to adjust the distance from the semiconductor substrate 12 to the cap substrate 14. The height of the spacer 15 that joins the semiconductor substrate 12 and the projecting portion 14P on the cap substrate 14 may be 0.5 to 3 μm, and the distance from the semiconductor substrate 12 to the cap substrate 14 is preferably 10 to 100 μm.

Also in the semiconductor package that is provided with the penetration electrode and the solder bump, it is possible to also include a projecting portion 14P on the cap substrate as shown in (b) of FIG. 2, in which case at least the same advantages as the exemplary embodiment of (b) of FIG. 1 may also be achieved.

2. Second Exemplary Embodiments of the Semiconductor Package

Figure 3:
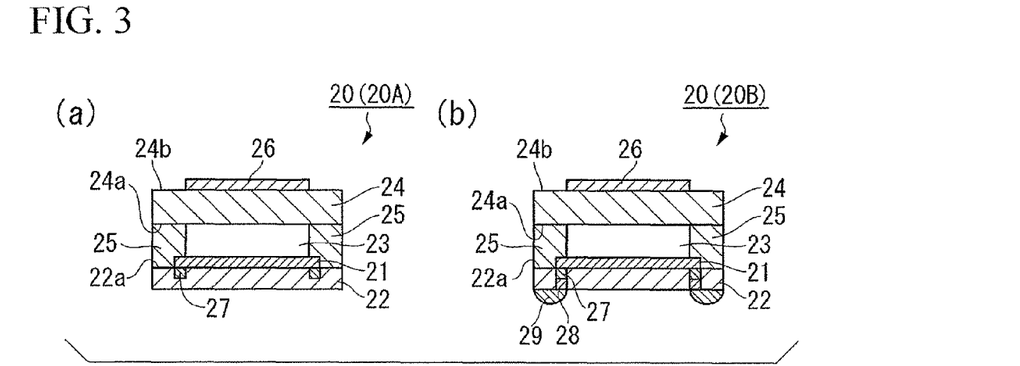
FIG. 3 is a cross-sectional view another exemplary embodiment of the semiconductor package.
Figure 4:
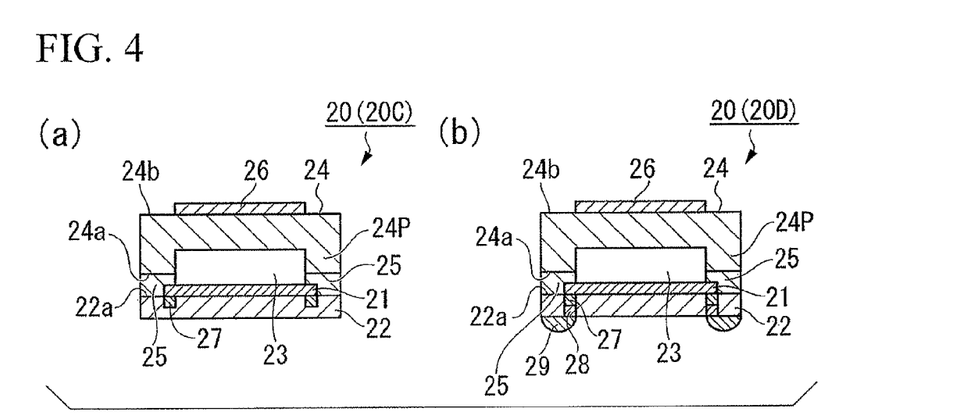
FIG. 4 is a cross-sectional view of an alternative exemplary embodiment of the embodiment of FIG. 3.

FIG. 3 is a cross-sectional view of a second exemplary embodiment of the semiconductor package. FIG. 4 is an alternative exemplary embodiment of the embodiment shown in FIG. 3.

As shown in FIG. 3, it is possible to arrange a filter 26 on an other surface 24b of a cap substrate 24. In this case as well, the filter 26 may be directly disposed on the other surface 24b of the cap substrate 24, or the filter 26 may be disposed via an object which is disposed on the other surface 24b of the cap substrate 24. Also, since the position at which this filter 26 is arranged does not overlap with the dicing location, it avoids being chipped during dicing. Moreover, since it is not in contact with a spacer 25, it is possible to avoid the exfoliation of the filter 26 due to the stress of expansion and contraction of the spacer 25 as conventionally seen. Since this filter 26 is provided on the outer peripheral portion of the semiconductor package 20, unnecessary light that is directed toward the semiconductor device 21 can be blocked before entering the semiconductor package 20.

(b) of FIG. 3 illustrates an embodiment that includes penetration electrodes 28 and the solder bumps 29 similar to the exemplary embodiments of (b) of FIG. 1 and (b) of FIG. 2.

FIG. 4 is an alternative embodiment of the embodiment of FIG. 3, and includes a projecting portion 24P provided on the cap substrate 24. With this arrangement, at least the same advantages of the embodiment of FIG. 2 may be achieved.

3. Third Exemplary Embodiment of the Semiconductor Package

Figure 5:
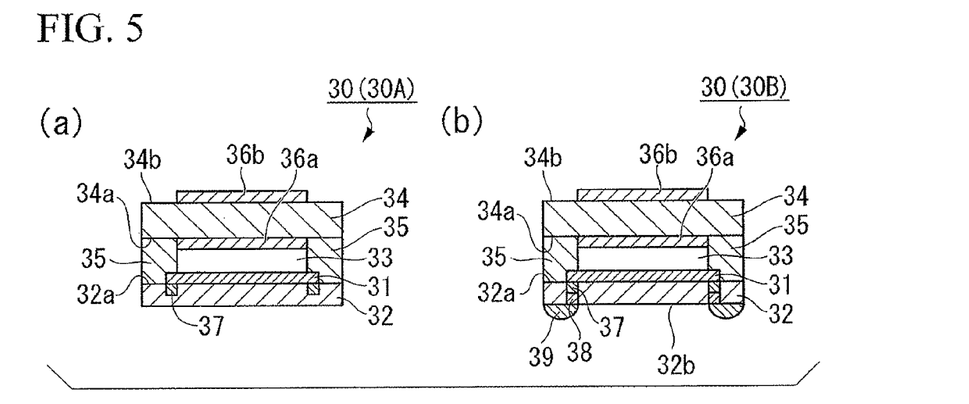
FIG. 5 is a cross-sectional view of another exemplary embodiment of the semiconductor package.
Figure 6:
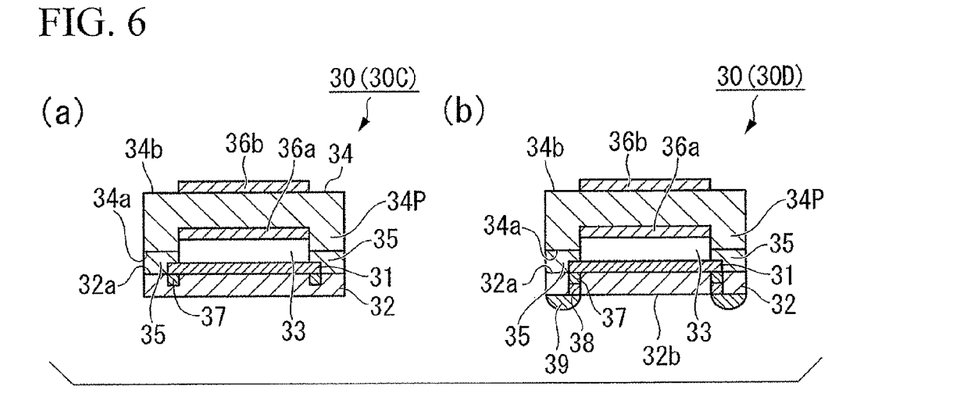
FIG. 6 is a cross-sectional view of an alternative exemplary embodiment of the embodiment of FIG. 5.

FIG. 5 is a cross-sectional view of a third exemplary embodiment of the semiconductor package. FIG. 6 is an alternative embodiment of the embodiment of FIG. 5.

As shown in FIG. 5, it is possible to arrange a filter 36 on both the one surface 34a and the other surface 34b of a cap substrate. That is, a semiconductor substrate 32, a first filter 36a, a cap substrate 34, and a second filter 36b are arranged in an overlapping manner in that order. In relation to the arrangement of the first filter 36a and the second filter 36b, they may be disposed directly on the cap substrate 34, or may be indirectly disposed via an object which is disposed on the cap substrate 34. In either case, since the first filter 36a and the second filter 36b are disposed at positions that do not overlap with the spacer 35 similar to the aforementioned exemplary embodiments, it is possible to prevent exfoliation of the filter due to chipping during dicing.

Similar to the aforementioned exemplary embodiments, since the spacer 35 is not directly bonded to both filters 36a and 36b, it is possible to prevent these filters 36 from exfoliating from stress due to expansion and contraction of the spacer 35. Moreover, in the case of disposing the filter 36 on both surfaces of the cap substrate 34, since stress of the filter 36 is applied to both surfaces of the cap substrate 34, it is possible to relieve warping of the cap substrate 34. In the case of an optical semiconductor device, by changing the combination of the first filter 36a and the second filter 36b, for example by changing the combination of an ND filter and a band pass filter, it is possible to manufacture an optical semiconductor package 30 corresponding to various situations.

(b) of FIG. 5 is an embodiment that includes penetration electrodes 38 and solder bumps 39 similar to (b) of FIG. 1 and (b) of FIG. 3.

FIG. 6 is an alternative embodiment of the embodiment of FIG. 5, and includes a projecting portion 34P is provided on the cap substrate 34. With this arrangement, it may be possible to obtain at least the same advantages of the exemplary embodiments of FIGS. 2 and 4.

Figure 7:
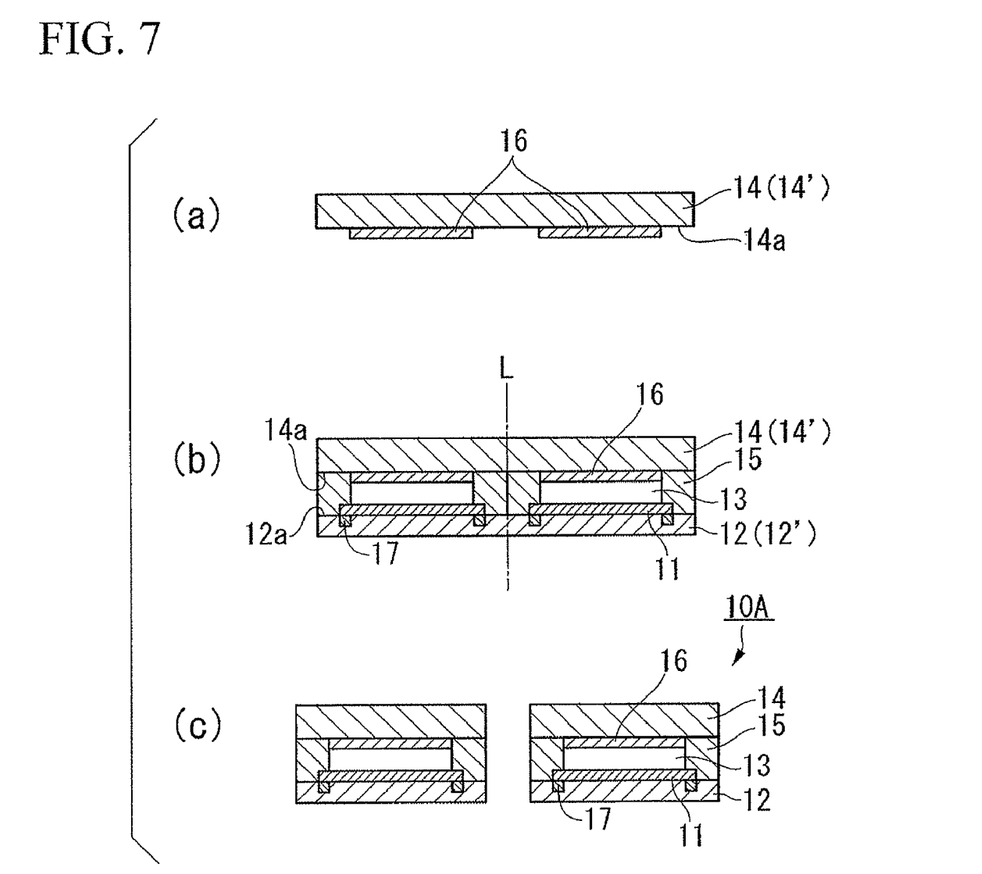
FIG. 7 is a cross-sectional process drawing of an exemplary embodiment of a method of manufacturing the semiconductor package of (a) of FIG. 1.
Figure 10:
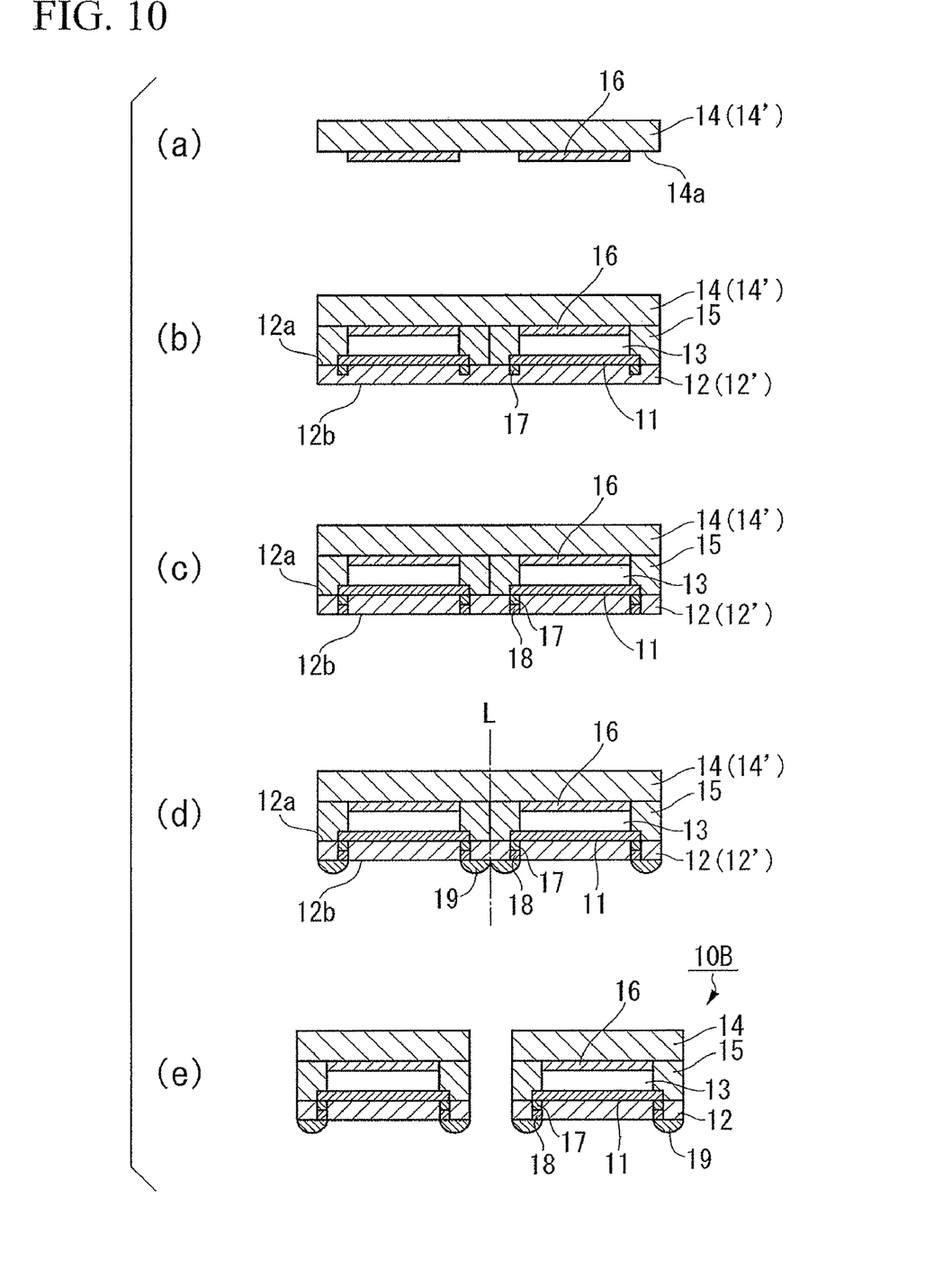
FIG. 10 is a cross-sectional process drawing of an exemplary embodiment of a method of manufacturing the semiconductor package of (b) of FIG. 1.

4. First Exemplary Embodiment of Method of Manufacturing a Semiconductor Package FIG. 7 illustrates a method of manufacturing the exemplary embodiment of the semiconductor package shown in (a) of FIG. 1. FIG. 10 illustrates a method of manufacturing the exemplary embodiment of the semiconductor package shown in (b) of FIG. 1.

In FIG. 7, the cap substrate denoted 14(14') is an aggregate of a plurality of cap substrates 14 of (a) of FIG. 1, and the semiconductor substrate denoted 12(12') is an aggregate of a plurality of the semiconductor substrates 12 of (a) of FIG. 1. Similarly, in FIG. 10, the cap substrate denoted 14(14') and the semiconductor substrate denoted 12(12') are respective aggregates of a plurality of cap substrates 14 and a plurality of semiconductor substrates 12 of (b) of FIG. 1.

As shown in FIG. 7, in the method of manufacturing the semiconductor package 10A of the exemplary embodiment of (a) of FIG. 1, first the filter 16 is formed on the surface 14a of the cap substrate 14 as shown in (a) of FIG. 7. As one example of this method of forming the filter 16 on the cap substrate 14, after forming a photosensitive resin on the surface 14a of the cap substrate 14 using a spin coater or the like, a pattern in accordance with the use condition is formed by technique of photolithography. The photosensitive resin may be a photopolymerization-type acrylic resin or a material based on photo-crosslinkable polyvinyl alcohol. Also, when forming a color filter, it is possible to form it by an etching method with a polyimide precursor that is dispersed with a pigment serving as a colored resin layer. Alternatively, the method may include laminating $TiO_2$, $SiO_2$, $MgF_2$, $Ta_2O_5$ and the like by vapor deposition.

Next, as shown in (b) of FIG. 7, the spacer 15 is formed so as to be installed in a projecting manner on the cap substrate 14a, and the semiconductor substrate 12' on which the semiconductor device 11 and the electrode 17 are disposed is bonded. The cap substrate 14 is made to face the semiconductor substrate 12', and the spacer 15 that is formed on the surface 14a of the cap substrate 14 is bonded to the surface 12a of the semiconductor substrate 12. Thereby, the semiconductor substrate 12 and the cap substrate 14 are joined via the spacer 15. These components may be joined using an epoxy resin or a photosensitive BCB resin or the like.

Next, the semiconductor substrate 12, the spacer 15, and the cap substrate 14 are divided by a dicing saw or the like along the cutting line L shown in (b) of FIG. 7 so that the spacer 15 is cut in two, and the semiconductor package 10A of the present exemplary embodiment is obtained as shown in (c) of FIG. 7.

According to the manufacturing method of the semiconductor package 10A of the exemplary embodiments, since the filter 16 is formed on a portion of the surface 14a of the cap substrate 14 without being formed on the entire surface thereof, it is possible to relieve warping of the cap substrate 14 by the stress of the filter 16. Also, because the filter 16 is not installed on the dicing location L, it is possible to prevent exfoliation of the filter 16 by chipping due to dicing. Furthermore, since the filter 16 is not caught between the spacer 15 and the cap substrate 14, it is possible to also prevent the filter 16 from exfoliating by the stress arising from the expansion and contraction of the spacer 15. Also, since the filter 16 is formed inside of the semiconductor package 10A, the filter 16 is protected during the processing of the semiconductor package 10A.

FIG. 10 illustrates a method of manufacturing the semiconductor package 10B provided with penetration electrodes and solder bumps. First, the filter 16 is formed on the surface 14a of the cap substrate 14 as shown in (a) of FIG. 10, which is similar to that of FIG. 7.

Next, as shown in (b) of FIG. 10, the spacer 15 is formed so as to be installed in a projecting manner on the cap substrate 14a, and the semiconductor substrate 12 on which the semiconductor device 11 and the electrode 17 are disposed is bonded to the spacer 15. This is similar to that of FIG. 7(*b*).

Next, as shown in (c) of FIG. 10, through holes are formed from the other surface 12*b* of the semiconductor substrate 12 toward the electrode 17. The through holes may be formed, for example, by using a silicon deep etching apparatus (DeepRIE). An $SiO_2$ layer is formed in each through hole as an oxide film layer using plasma-enhanced chemical vapor deposition to form an insulative layer in each through hole. Next, using reactive ion etching, the $SiO_2$ layer of the hole bottom portion is selectively removed. Thereafter, a seed layer is formed by sputtering, and the penetration electrode 18 and, although not shown in the drawing, where necessary a back wiring layer, are formed by electrolytic plating.

Next, as shown in (d) of FIG. 10, the solder bumps 19 are formed so as to be electrically connected to the penetration electrodes 18. For example, the solder bumps 19 may be formed by performing a HASL process, OSP process, electroless Ni-immersion Au process, or immersion Ag process, or the like, according to necessity. Also, although not shown in the drawing, in the case of manufacturing a back wiring layer, the solder bumps 19 are manufactured so as to be electrically connected to the back wiring layer.

Next, the semiconductor substrate 12 and the cap substrate 14 are divided along the cutting line L shown in (d) of FIG. 10 so that the spacer 15 is cut in two, whereby the semiconductor package 10B that is provided with the penetration electrodes 18 and the solder bumps 19 is obtained as shown in (e) of FIG. 10.

According to the manufacturing method of the semiconductor package 10B, since the filter 16 is not installed on the dicing location L, it is possible to prevent exfoliation of the filter 16 by chipping due to dicing. Furthermore, since the filter 16 is formed on a portion of the surface 14*a* of the cap substrate 14 without being formed on the entire surface thereof, it is possible to relieve warping of the cap substrate 14 by the stress of the filter 16. Furthermore, since the filter 16 is not caught by the spacer 15 and the cap substrate 14, it is possible to also prevent the filter 16 from exfoliating by the stress arising from the expansion and contraction of the spacer 15. In addition, since the filter 16 is formed inside of the semiconductor package 10B, the filter 16 is protected during the processing of the semiconductor package 10B. In relation to the penetration electrode 18, since the opening location is not disposed on the dicing location, it is possible to prevent entry of particles or the like and deformation and the like due to dicing.

Figure 8:
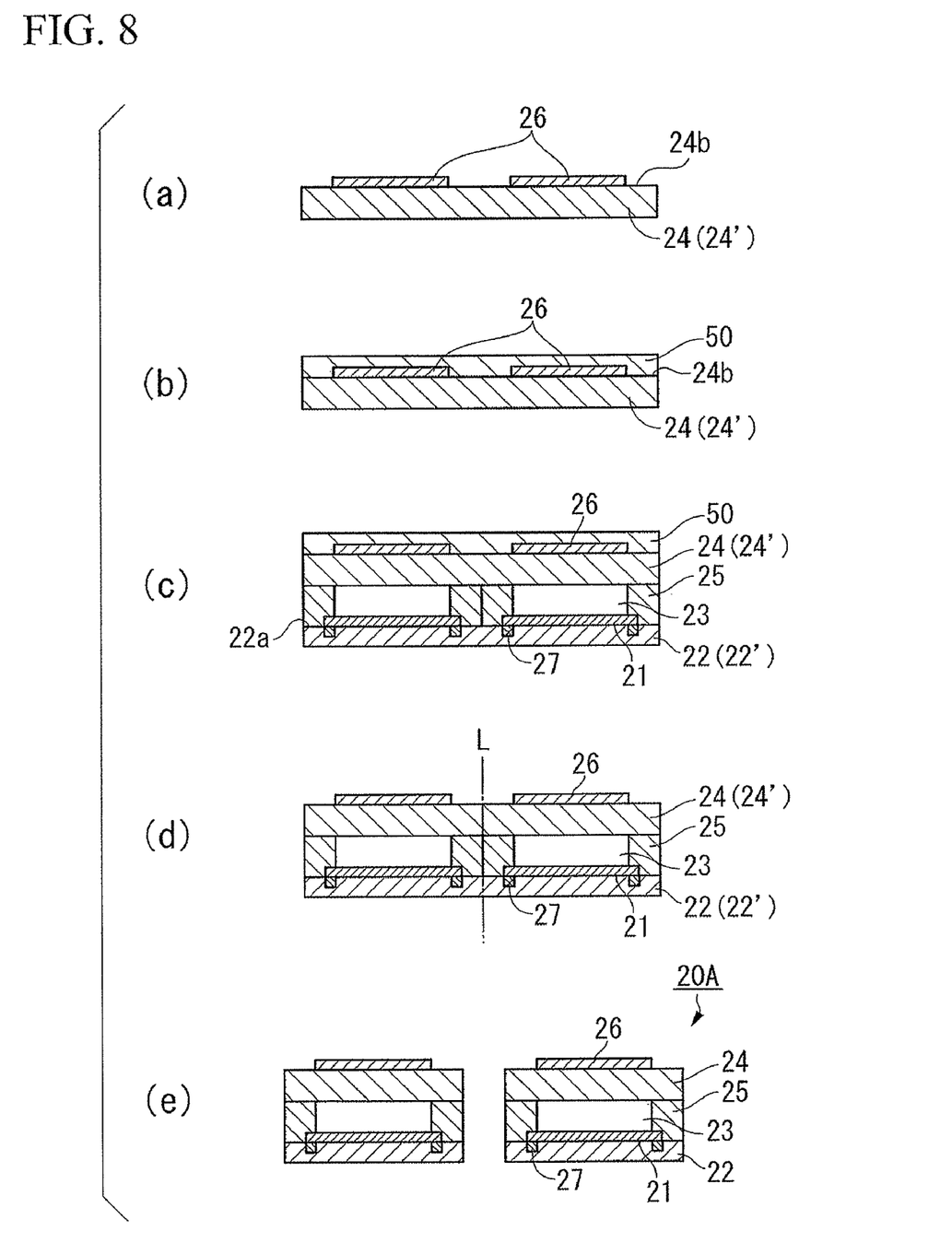
FIG. 8 is a cross-sectional process drawing of an exemplary embodiment of a method of manufacturing the semiconductor package of (a) of FIG. 3.
Figure 11:
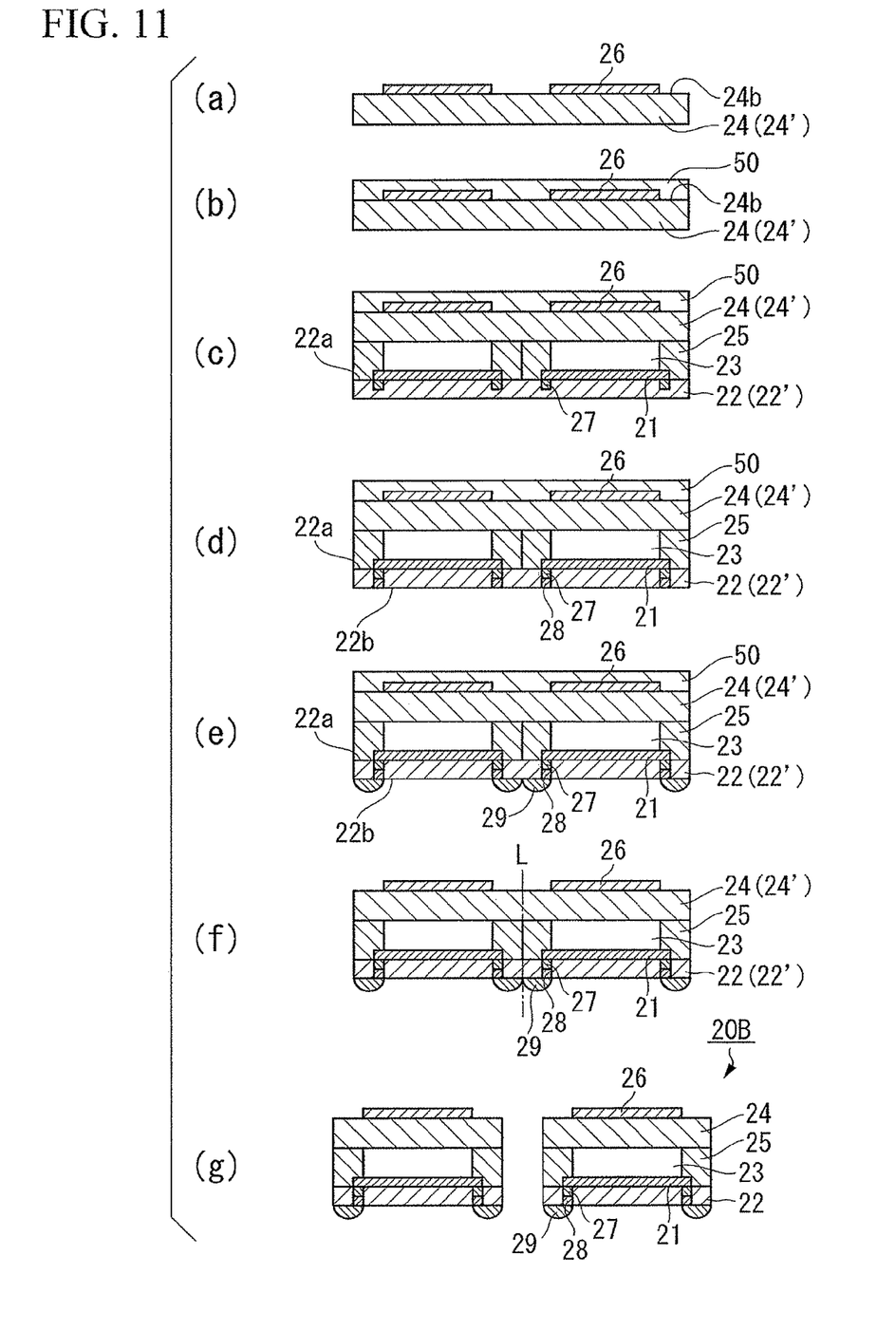
FIG. 11 is a cross-sectional process drawing of an exemplary embodiment of a method of manufacturing the semiconductor package of (b) of FIG. 3.

5. Second Exemplary Embodiments of Method of Manufacturing a Semiconductor Package FIG. 8 is a cross-sectional process drawing that illustrates a method of manufacturing the semiconductor package 20A shown in (a) of FIG. 3. FIG. 11 is a cross-sectional process drawing illustrating a method of manufacturing the semiconductor package of (b) of FIG. 3.

In the second exemplary embodiments of the method, explanations that overlap with the first exemplary embodiments of the method shall be omitted. In FIG. 8, element 24(24') denotes an aggregate of a plurality of cap substrates 24 of (a) of FIG. 3, and element 22(22') denotes an aggregate of a plurality of semiconductor substrates 22 of (a) of FIG. 3. Similarly, in FIG. 11, elements 24(24') and 22(22') respectively denote an aggregate of a plurality of cap substrates 24, and an aggregate of a plurality of semiconductor substrates 22 of (b) of FIG. 3.

In the manufacturing method in the second exemplary embodiment, first the filter 26 is formed on the other surface 24*b* of the cap substrate 24, as shown in (a) of FIG. 8. The method of forming the filter 26 is similar to that of the first exemplary embodiment of the method.

As shown in (b) of FIG. 8, a protective film 50 is formed so as to cover the filter 26. The protective film 50 may be a film that can be removed in a subsequent step, and is, for example, a film that uses a resin that can be removed or a fine adhesion film. The protective film 50 may instead be a laminate of film, or a spin coat of resin that can be removed, or the like.

Next, similar to the embodiment shown in (b) of FIG. 7, the cap substrate 24, the spacer 25, and the semiconductor substrate 22 are joined as shown in (c) of FIG. 8.

Next, as shown in (d) of FIG. 8, the protective film 50 that was formed in (b) of FIG. 8 is removed. In relation to the removal of the protective film 50, a chemical (or in the case of film, a separator) may be used so as not to damage the filter 26. Alternatively, the protective film 50 may be removed by performing a dry process such as $O_2$ ashing.

Next, the semiconductor substrate 22, the spacer 25, and the cap substrate 24 are divided along the cutting line L shown in (d) of FIG. 8, whereby the semiconductor package 20A of the present exemplary embodiment is obtained as shown in (e) of FIG. 8.

According to the manufacturing method of the semiconductor package 20A of the second exemplary embodiment of the method, it is possible to prevent exfoliation of the filter 26 by at least the same reasons as those of the first exemplary embodiment of the method. Also, since the filter 26 that is formed on the other surface 24*b* of the cap substrate 24 is covered by the protective film 50 after formation of the filter 26, it is possible to prevent damage to the filter 26 during the manufacturing process.

FIG. 11 is a cross-sectional process drawing that illustrates the method of manufacturing the semiconductor package 20B shown in (b) of FIG. 3. Descriptions that overlap with the manufacturing process of FIG. 10 shall be omitted.

In the manufacturing method in the present exemplary embodiment, first the filter 26 is formed on the other surface 24*b* of the cap substrate 24 as shown in (a) of FIG. 11. The method of forming the filter 26 is the same as that of part (a) of FIG. 10.

Next, as shown in (b) of FIG. 11, a protective film 50 is formed so as to cover the filter 26, which is similar to that of (b) of FIG. 8.

Next, similarly to (b) of FIG. 10, the cap substrate 24, the spacer 25, and the semiconductor substrate 22 are joined as shown in (c) of FIG. 11.

Next, as shown in (d) of FIG. 11, the penetration electrode 28 is formed from the other surface 22*b* of the semiconductor substrate 22 toward the electrode 27. In relation to the formation of the penetration electrode 28, it is the same as (c) of FIG. 10.

Next, as shown in (e) of FIG. 11, the solder bump 29 is formed similar to that shown in (d) of FIG. 10 so as to be electrically connected to the penetration electrode 28.

Next, as shown in (f) of FIG. 11, the protective film 50 that was formed in (b) of FIG. 11 is removed, which is similar to the first exemplary embodiment of the method.

Next, the semiconductor substrate 22, the spacer 25, and the cap substrate 24 are divided along the cutting line L shown in (f) of FIG. 11, whereby the semiconductor package 20B of the present exemplary embodiment is obtained as shown in (g) of FIG. 11.

According to the manufacturing method of the present exemplary embodiment, it is possible to prevent exfoliation of the filter 26 by at least the same reason as the first embodiment of the method shown in FIG. 10. Also, since the filter 26 that is formed on the other surface 24*b* of the cap substrate 24 is covered by the protective film 50 after formation of the filter 26, it is possible to prevent damage to the filter 26 during the manufacturing process. Also, in relation to the penetration electrodes 28, since the opening location is not disposed at the dicing location, it is possible to prevent entry of particles or the like and defamation or the like due to dicing.

Figure 9:
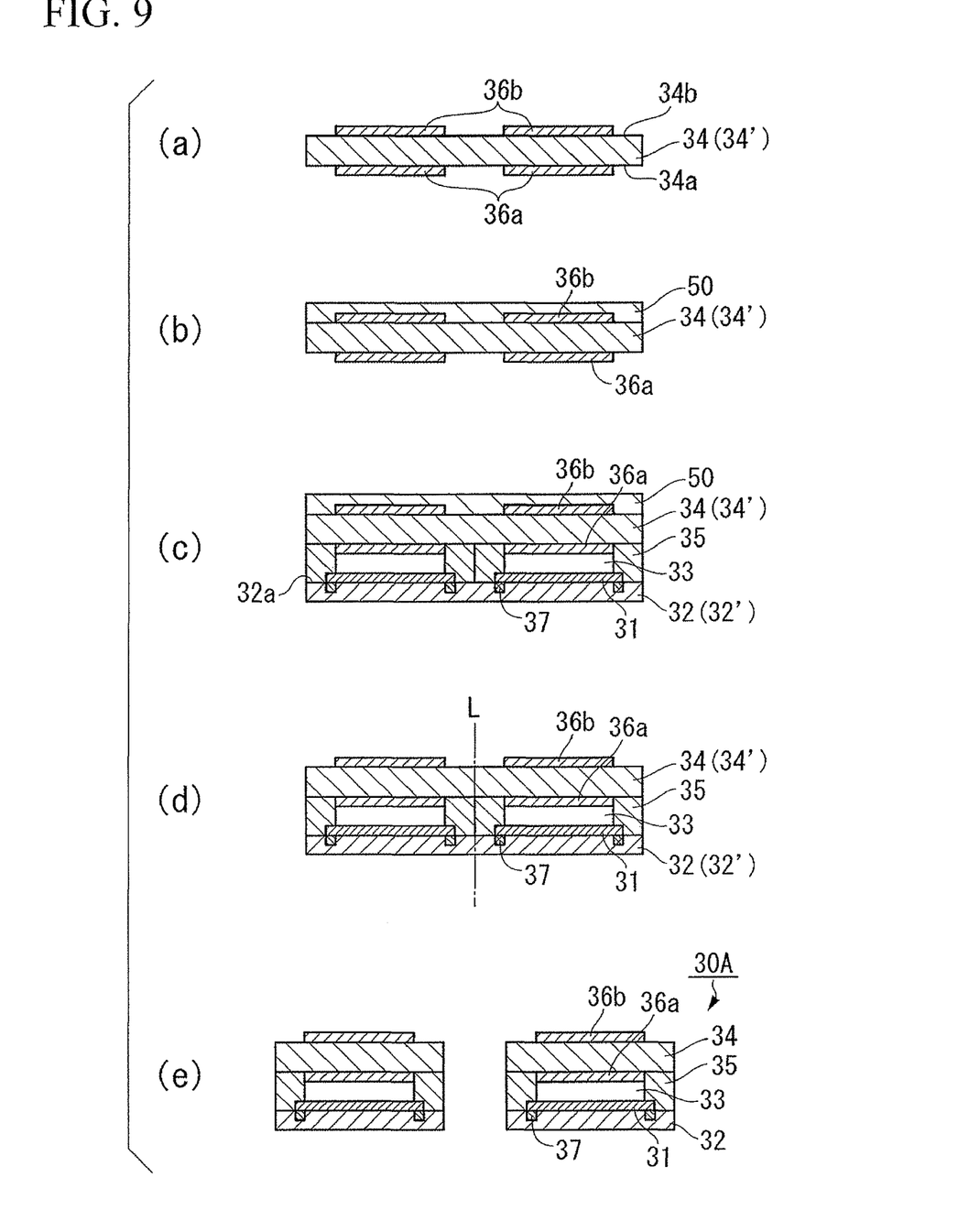
FIG. 9 is a cross-sectional process drawing of an exemplary embodiment of a method of manufacturing the semiconductor package of (a) of FIG. 5.
Figure 12:
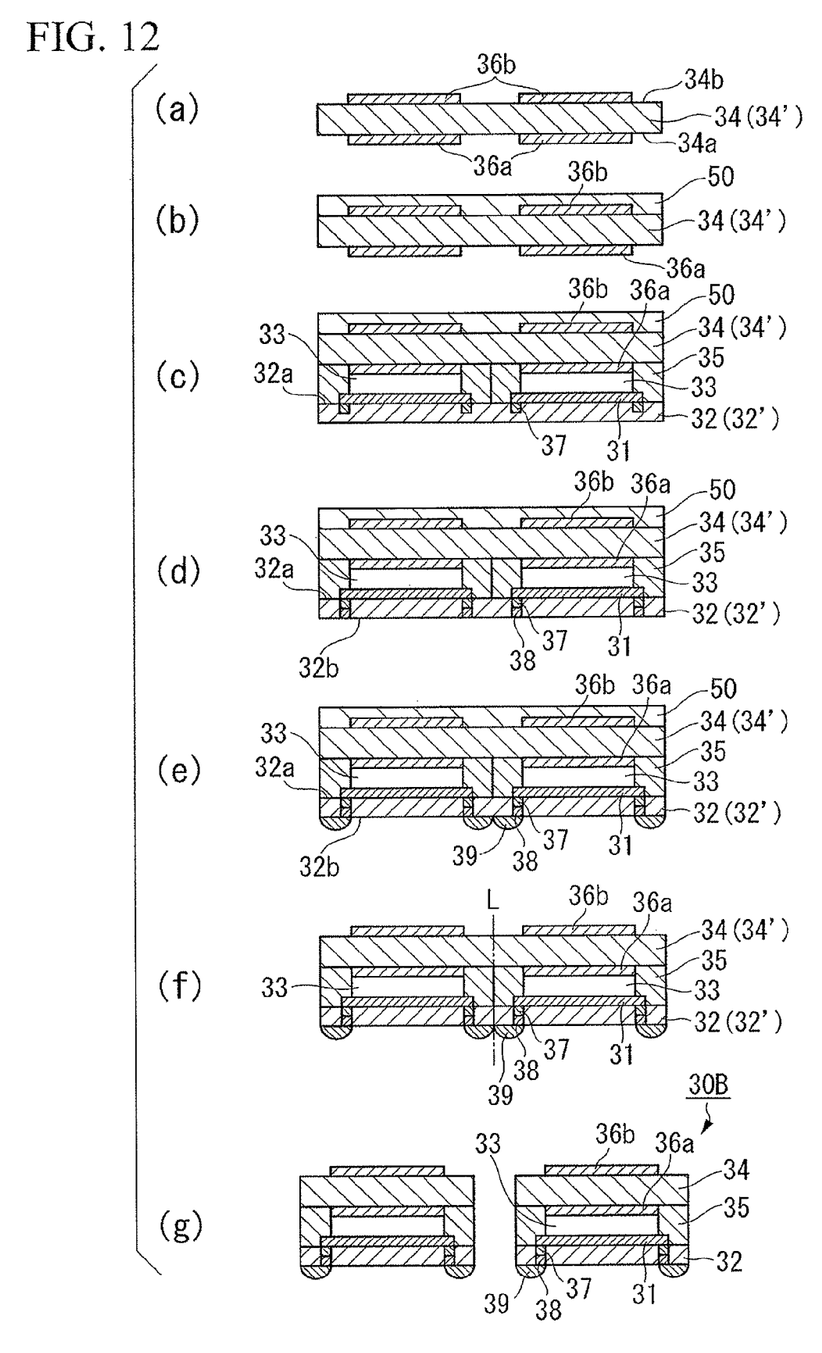
FIG. 12 is a cross-sectional process drawing of an exemplary embodiment of a method of manufacturing the semiconductor package of (b) of FIG. 5.

6. Third Exemplary Embodiment of Method of Manufacturing a Semiconductor Package FIG. 9 is a cross-sectional process drawing that illustrates a method of manufacturing the semiconductor package 30A shown in (a) of FIG. 5. FIG. 12 is a cross-sectional process drawing illustrating a method of manufacturing the semiconductor package of (b) of FIG. 5.

Descriptions that overlap with the first exemplary embodiments of the method and the second exemplary embodiments of the method shall be omitted. In FIG. 9, element 34(34') denotes an aggregate of a plurality of cap substrates 34 shown in (a) of FIG. 5 and element 32(32') denotes an aggregate of a plurality of semiconductor substrates 32 shown in (a) of FIG. 5. Similarly, elements 34(34') and 32(32') of FIG. 12 respectively denote an aggregate of a plurality of cap substrates 34 and an aggregate of a plurality of semiconductor substrates 32 shown in (b) of FIG. 5.

In the method of manufacture in the third exemplary embodiment, first the first filter 36a and the second filter 36b are formed on the surface 34a of the cap substrate 34 and the other surface 34b of the cap substrate 34, respectively, as shown in (a) of FIG. 9. The method of forming the first filter 36a and the second filter 36b is similar to that of the first exemplary embodiment of the method and the second exemplary embodiment of the method.

Next, as shown in (b) of FIG. 9, the second filter 36b is covered with a protective film 50 which is the same as the case of the second exemplary embodiment of the method.

Next, similar to (b) of FIG. 7 of the first exemplary embodiment, the cap substrate 34, the spacer 35, and the semiconductor substrate 32 are joined as shown in (c) of FIG. 9.

Next, as shown in (d) of FIG. 9, the protective film 50 that was formed in (b) of FIG. 9 is removed. This step is the same as the method shown in (d) of FIG. 8 of the second exemplary embodiment of the method.

Finally, the semiconductor substrate 32, the spacer 35, and the cap substrate 34 are divided along the cutting line L shown in (d) of FIG. 9, whereby the semiconductor package 30A of the present exemplary embodiment is obtained as shown in (e) of FIG. 9.

In the third exemplary embodiment, it is possible to prevent exfoliation of the first filter 36a and the second filter 36b for at least the same reasons as the first exemplary embodiment of the method and the second exemplary embodiment of the method. Also, in relation to the first filter 36a, since the filter is formed in the semiconductor package 30, and also in relation to the second filter 36b since it is provided with a step of covering with a protective film, it is possible to prevent damage to both filters during the manufacturing process.

FIG. 12 is a cross-sectional process drawing that describes the method of manufacturing the semiconductor package 30B shown in (b) of FIG. 5.

First, the first filter 36a and the second filter 36b are formed on the surface 34a of the cap substrate 34 and the other surface 34b of the cap substrate 34, respectively, as shown in (a) of FIG. 12. The method of forming the first filter 36a and the second filter 36b is similar to the manufacturing process of FIG. 10.

Next, as shown in (b) of FIG. 12, the second filter 36b is covered with a protective film 50. Forming the protective film 50 is the same as the manufacturing process of (b) of FIG. 11.

Next, similar to (b) of FIG. 10, the cap substrate 34, the spacer 35, and the semiconductor substrate 32 are joined as shown in (c) of FIG. 12. Next, as shown in (d) of FIG. 12, the penetration electrode 38 is formed between the other surface 32b of the semiconductor substrate 32 and the electrode 37. Formation of the penetration electrode 38 is the same as that of (c) of FIG. 10.

Next, as shown in (e) of FIG. 12, the solder bump 39 is formed similar to (d) of FIG. 10 so as to be electrically connected to the penetration electrode 38.

Next, as shown in (f) of FIG. 12, the protective film 50 that was formed in (b) of FIG. 12 is removed. This step is the same as (f) of FIG. 11.

Next, the semiconductor substrate 32, the spacer 35, and the cap substrate 34 are divided along the cutting line L shown in (f) of FIG. 12, whereby the semiconductor package 30B of the present exemplary embodiment is obtained as shown in (g) of FIG. 12.

In the present exemplary embodiment, it is possible to prevent exfoliation of the first filter 36a and the second filter 36b by at least the same reason as the manufacturing steps of FIG. 11 and FIG. 12. Also, in relation to the first filter 36a, since the filter is formed in the semiconductor package 30B, and also in relation to the second filter 36b since it is provided with a step of covering with the protective film 50, it is possible to prevent damage to both filters during the manufacturing process. Also, in relation to the penetration electrode 38, since the opening location is not disposed on the dicing location, it is possible to prevent entry of particles or the like and deformation or the like due to dicing.

7. Exemplary Embodiment of Method of Manufacturing a Semiconductor Package that Includes a Projecting Portion In the first exemplary embodiment of the method of manufacture, a semiconductor package that is provided with the projecting portion 14P on the cap substrate 14 may be used, as shown in FIG. 2. In the case of the spacer 15 being formed from resin, since the moisture permeability coefficient of resin is high, when the closure thickness of the resin is thick, there is a possibility of condensation forming in the gap 13. Also, if the distance from the semiconductor substrate 12 to the cap substrate 14 is short, optical problems related to imaging characteristics will arise. By providing the cap substrate 14 with the projecting portion 14P in order to deal with both of these, a height of the resin layer with a high moisture permeability coefficient can be reduced, and the condensation is suppressed. Further, by controlling the projecting portion 14P on the cap substrate 14, it is possible to adjust the distance from the semiconductor substrate 12 to the cap substrate 14. The height of the spacer 15 that joins the semiconductor substrate 12 and the projecting portion 14P on the cap substrate 14 may be 0.5 to 3 µm, and the distance from the semiconductor substrate 12 to the cap substrate 14 may be 10 to 100 µm.

Also, by similarly providing the projecting portion on the cap substrate in the manufacturing process of the second exemplary embodiment and the manufacturing process of the third embodiment, it is possible to achieve the same effects as above.

Furthermore, of the advantages of providing the projecting portion exist for methods of manufacturing a semiconductor device that is provided with penetration electrodes and soldering bumps.

The present invention has been described with reference to exemplary embodiments of the semiconductor package and of the method of manufacturing the semiconductor package. However, it is understood that the scope of the invention is not limited to these exemplary embodiments.

The invention claimed is:

1. A semiconductor package comprising:
a semiconductor device;
a semiconductor substrate having the semiconductor device arranged on one surface of the semiconductor substrate;
a cap substrate having one surface that opposes the one surface of the semiconductor substrate via a gap;
a spacer that is arranged between the one surface of the semiconductor substrate and the one surface of the cap substrate, and that joins the semiconductor substrate and the cap substrate; and
a filter that is laminated on the cap substrate so as to overlap with the semiconductor device without overlapping with the spacer, thereby reducing separation of the filter from the cap substrate due to dicing.

2. The semiconductor package according to claim 1, wherein the filter is disposed between the semiconductor substrate and the cap substrate.

3. The semiconductor package according to claim 1, wherein the filter is disposed at an other surface of the cap substrate, opposite to the one surface of the cap substrate.

4. The semiconductor package according to claim 1, wherein the filter includes a first filter and a second filter, and the first filter is disposed between the semiconductor substrate and the cap substrate, and the second filter is disposed at an other surface of the cap substrate opposite to the one surface of the cap substrate.

5. The semiconductor package according to claim 1, further comprising:
an electrode that is disposed at the one surface of the semiconductor substrate and in electrical contact with the semiconductor device;
a penetration electrode that is provided between an other surface of the semiconductor substrate opposite to the one surface of the semiconductor substrate, and the electrode; and
a solder bump that is electrically connected with the penetration electrode.

6. A method of manufacturing a semiconductor package provided with a semiconductor device; a semiconductor substrate having the semiconductor device arranged on one surface; a cap substrate having one surface that opposes the one surface of the semiconductor substrate via a gap; a spacer that is arranged between the one surface of the semiconductor substrate and the one surface of the cap substrate, and that joins the semiconductor substrate and the cap substrate; and a filter that is provided on the cap substrate so as to overlap with the semiconductor device without overlapping with the spacer, the method comprising:
forming a plurality of the filters on the cap substrate;
placing a plurality of semiconductor devices on one surface of the semiconductor substrate;
after placing the semiconductor devices, bonding the semiconductor substrate to the cap substrate through a plurality of the spacers so as to sandwich a dividing portion defined by adjacent ones of the spacers abutting one another, between the semiconductor substrate and the cap substrate,
wherein the bonding forms a structure that comprises the cap substrate, the plurality of semiconductor devices, the semiconductor substrate, and the spacers; and
dividing the structure at an area of the dividing portion.

7. The method of manufacturing a semiconductor package according to claim 6, further comprising:
forming a penetration electrode to be electrically connected from an other surface side of the semiconductor substrate toward the semiconductor device; and
forming a solder bump that is electrically connected with the penetration electrode.

8. A semiconductor package comprising:
a semiconductor substrate;
a semiconductor device disposed on a first surface of the semiconductor substrate;
a cap substrate having a first surface spaced from the first surface of the semiconductor substrate along a first direction;
a spacer disposed between the first surface of the semiconductor substrate and the first surface of the cap substrate, wherein the spacer joins the semiconductor substrate and the cap substrate; and
a filter laminated on the cap substrate;
wherein the filter overlaps at least a part of the semiconductor and does not overlap the spacer when viewed along the first direction, thereby reducing separation of the filter from the cap substrate due to dicing.

9. The semiconductor package according to claim 8, wherein the cap substrate, the spacer, and the semiconductor substrate form a hermetically sealed gap therebetween.

10. The semiconductor package according to claim 9, wherein the filter is disposed within the hermetically sealed gap.

11. The semiconductor package according to claim 8, wherein the filter is disposed on a second surface of the cap substrate that is opposed to the first surface of the cap substrate, and the semiconductor package further comprises a protective film formed on a surface of the filter facing away from the second surface of the cap substrate.

12. The semiconductor package according to claim 8, wherein the cap substrate further comprises a projection portion extending toward the semiconductor substrate and overlapping at least a portion of the spacer when viewed along the first direction.

13. The semiconductor package according to claim 8, further comprising:
an electrode disposed at the first surface of the semiconductor substrate and in electrical contact with the semiconductor device;
a penetration electrode that is provided between a second surface of the semiconductor substrate opposed to the first surface of the semiconductor substrate, and the electrode; and
a solder bump that is electrically connected with the penetration electrode.

14. The semiconductor package according to claim 8, wherein the filter includes a first filter disposed between the cap substrate and the semiconductor substrate, and a second filter disposed at a second surface of the cap substrate opposed to the first surface of the cap substrate.

* * * * *